United States Patent
Suzuki et al.

(10) Patent No.: US 11,524,349 B2
(45) Date of Patent: Dec. 13, 2022

(54) SUBSTRATE

(71) Applicant: Yazaki Corporation, Tokyo (JP)

(72) Inventors: Shingo Suzuki, Susono (JP); Antony Wambugu Ngahu, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 323 days.

(21) Appl. No.: 16/391,832

(22) Filed: Apr. 23, 2019

(65) Prior Publication Data
US 2019/0329340 A1     Oct. 31, 2019

(30) Foreign Application Priority Data

Apr. 26, 2018   (JP) .............................. JP2018-085072

(51) Int. Cl.
  *H01F 27/28*   (2006.01)
  *B23H 1/02*    (2006.01)
  *B23H 7/04*    (2006.01)

(52) U.S. Cl.
  CPC ................. *B23H 1/02* (2013.01); *B23H 7/04* (2013.01)

(58) Field of Classification Search
  CPC .................................... B23H 1/02; B23H 7/04
  See application file for complete search history.

(56) References Cited

U.S. PATENT DOCUMENTS

| | | | |
|---|---|---|---|
| 7,719,398 B2 * | 5/2010 | Tsuzuki | H01F 17/0013 336/200 |
| 2002/0092599 A1 * | 7/2002 | Tokuda | H01F 41/043 156/89.12 |
| 2003/0000622 A1 | 1/2003 | Tokuda et al. | |
| 2003/0026962 A1 | 2/2003 | Kawai et al. | |
| 2003/0030510 A1 * | 2/2003 | Sasaki | H03H 7/0115 333/185 |
| 2004/0201134 A1 | 10/2004 | Kawai et al. | |
| 2009/0160582 A1 | 6/2009 | Fukamachi et al. | |
| 2015/0022306 A1 * | 1/2015 | Scholz | H01F 27/2804 336/200 |
| 2016/0372254 A1 | 12/2016 | Harada et al. | |

FOREIGN PATENT DOCUMENTS

| | | |
|---|---|---|
| JP | 3-39821 U | 4/1991 |
| JP | 2009-153106 A | 7/2009 |
| JP | 2011-18505 A | 1/2011 |
| JP | 2014143233 A | 8/2014 |

* cited by examiner

*Primary Examiner* — Helena Kosanovic
*Assistant Examiner* — Ahmad Abdel-Rahman
(74) *Attorney, Agent, or Firm* — Sughrue Mion, PLLC (57) ABSTRACT

A substrate includes a multilayer substrate body in which a plurality of circuit bodies are laminated in a laminating direction through insulating layers and are interlayer connected via a connected conductor formed on each of the insulating layers, and a magnetic body that is arranged in the laminating direction while at least a part of or all of the magnetic body sandwiches the circuit bodies. Each of the circuit bodies includes at least a first circuit body and a second circuit body. The first circuit body is formed of a first extending portion and a first folding portion. The second circuit body is formed of a second extending portion and a second folding portion.

14 Claims, 12 Drawing Sheets

SUBSTRATE

CROSS-REFERENCE TO RELATED APPLICATION(S)

The present application claims priority to and incorporates by reference the entire contents of Japanese Patent Application No. 2018-085072 filed in Japan on Apr. 26, 2018.

BACKGROUND OF THE INVENTION

1. Field of the Invention

The present invention relates to a substrate.

2. Description of the Related Art

For a printed substrate, as a method for reducing noise without changing circuit design and the like, there is, for example, a method for arranging a pair of plate-like magnetic bodies so that the plate-like magnetic bodies are covered from an upper side, a lower side, and both side surfaces of an inductance circuit pattern-formed on an insulating layer (for example, see Japanese Patent Application Laid-open No. 2011-18505).

There is a laminate substrate formed by laminating a plurality of dielectric layers in which a band-pass filter is arranged side by side in a direction orthogonal to a laminating direction and the band-pass filter includes a plurality of coil patterns connected in series so as to be formed in a spiral shape (for example, see Japanese Patent Application Laid-open No. 2009-153106).

In the conventional substrate, even though a ferrite magnetic body having high magnetic permeability is used, a high inductance value is hard to be obtained, and, for example, high-frequency noise is unlikely to be reduced. Thus, a component for noise countermeasure needs to be added separately, and the conventional substrate has room for improvement in terms of cost efficiency.

SUMMARY OF THE INVENTION

In view of the foregoing, an object of the present invention is to provide a substrate capable of reducing noise at low cost.

In order to achieve the above mentioned object, a substrate according to one aspect of the present invention includes a multilayer substrate body in which a plurality of circuit bodies are laminated in a laminating direction through insulating layers and are interlayer connected via a connected conductor formed on each of the insulating layers; and a magnetic body that is arranged in the laminating direction while at least a part of or all of the magnetic body sandwiches the circuit bodies, wherein each of the circuit bodies includes: a first circuit body that is formed of a first extending portion extending from an input side to a first direction along a wiring direction and a first folding portion folded back from an end part of the first extending portion in the first direction to a second direction opposite to the first direction, and a second circuit body that is formed of a second extending portion extending from an output side to the second direction and a second folding portion folded back from an end part of the second extending portion in the second direction to the first direction.

According to another aspect of the present invention, in the substrate, it is possible to configure that each of the circuit bodies further includes a ground (GND) circuit body that is connected to GND, and the first circuit body and the GND circuit body are connected to each other through a capacitor.

According to still another aspect of the present invention, in the substrate, it is possible to configure that the magnetic body continuously surrounds at least outside of the first circuit body and the second circuit body around the wiring direction.

According to still another aspect of the present invention, in the substrate, it is possible to configure that the magnetic bodies are formed into a sheet-like shape, and are arranged opposite to each other in a laminating direction across at least the first circuit body and the second circuit body.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Embodiments of a substrate according to the present invention will now be described in detail with reference to the accompanying drawings. It should be noted that the embodiments are not intended to limit the present invention.

Components in the embodiments described below include what is called components that can be easily assumed by the skilled person or substantially like components. Furthermore, various kinds of omissions, substitutions, and changes may be made on the components in the embodiments described below without departing from the spirit of the present invention.

First Embodiment

A substrate 1A according to a first embodiment is described with reference to FIGS. 1 to 5. FIG. 3 corresponds to a partial cross-sectional view along line A-A in FIG. 2. In FIGS. 1 to 4 (the same applies to FIGS. 6 to 13), X direction of the substrate 1A (the same applies to substrates 1B to 1E) is referred to as a "width direction", Y direction thereof is referred to as a "depth direction", and Z direction thereof is referred to as a "laminating direction". The width direction (X direction), the depth direction (Y direction), and the laminating direction (Z direction) are orthogonal to each other. The laminating direction corresponds to a direction in which each layer of a multilayer substrate body 3, which will be described later, is laminated. Hereinafter, each of the directions represents, unless otherwise noted, a direction in a state in which each unit is assembled to each other.

Figure 1:
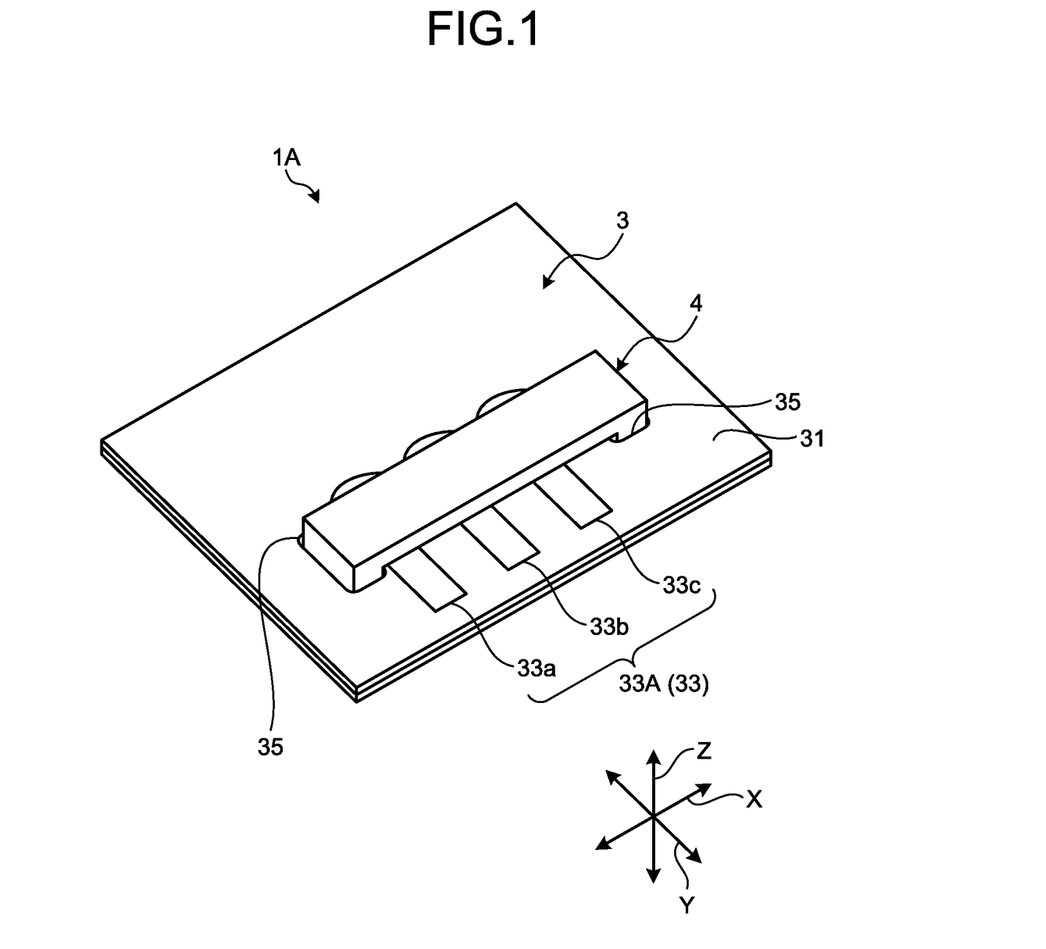
FIG. 1 is a perspective view illustrating the schematic configuration of a substrate according to a first embodiment.
Figure 2:
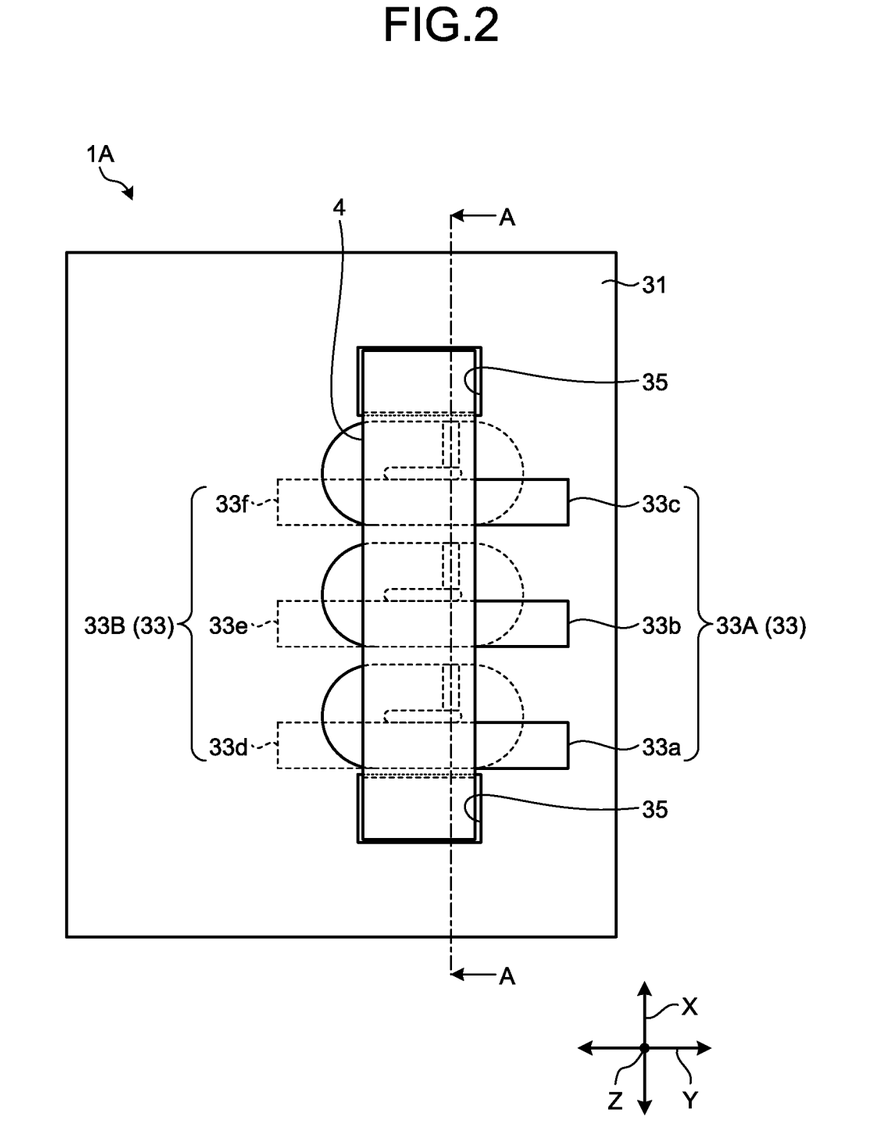
FIG. 2 is a plan view illustrating the schematic configuration of the substrate according to the first embodiment.
Figure 3:
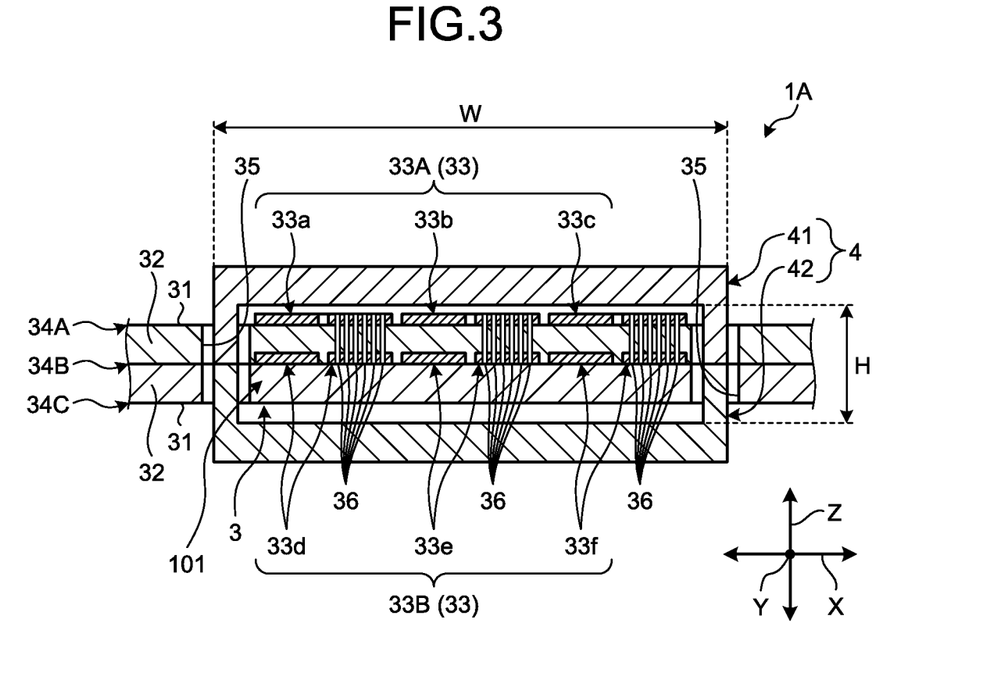
FIG. 3 is a partial cross-sectional view illustrating the schematic configuration of the substrate according to the first embodiment.

The substrate 1A illustrated in FIGS. 1 and 2 is applied to, for example, various kinds of electronic component units mounted on vehicles such as automobiles. An electronic unit includes, for example, the substrate 1A on which various kinds of electronic components are implemented. Examples of the electronic components include fuses, capacitors, relays, resistors, transistors, transverters, coils, intelligent power switches (IPSes), electronic control units (ECUs) including microcomputers, various kinds of sensors, light emitting diodes (LEDs), and speakers, but the electronic components are not limited to them. The substrate 1A of the present embodiment includes the multilayer substrate body 3 and a magnetic body 4.

The multilayer substrate body 3 has various kinds of electronic components described above implemented thereon, and forms an electric circuit that electrically connects the electronic components. For example, as illustrated in FIGS. 1 and 2, the multilayer substrate body 3 extends along the width and depth directions, and is formed into substantially a rectangular plate-like shape. The multilayer substrate body 3 has, for example, implementation faces 31 formed on both sides in the laminating direction, and has various kinds of electronic components implemented on the implementation faces 31. The multilayer substrate body 3 is what is called a printed circuit substrate. In the multilayer substrate body 3, a wiring pattern (print pattern) is printed on an insulating layer 32 formed of an insulating material such as an epoxy resin, a glass epoxy resin, a paper epoxy resin, and a ceramic by a conductive material such as copper so as to form a circuit body 33 with the wiring pattern. The multilayer substrate body 3 includes through-holes (not illustrated) formed by penetrating through the multilayer substrate body 3 along the laminating direction. Lead wire and terminals of electronic components are inserted into the through-holes, and are electrically connected to the circuit body 33 by soldering and the like.

The multilayer substrate body 3 is that a plurality of the circuit bodies 33 are laminated in the laminating direction through the insulating layers 32 and are interlayer connected via a connected conductor 36 formed on each of the insulating layers 32. As illustrated in FIG. 3, in the multilayer substrate body 3, a plurality of the insulating layers 32 on which the circuit bodies 33 are printed are laminated so as to form what is called a multilayer substrate in which the insulating layers 32 and the circuit bodies 33 are alternately laminated and are multi-layered. In the multilayer substrate body 3, by alternately laminating conductor layers of the circuit bodies 33 with respect to the insulating layers 32 for layers, the conductor layers of the circuit bodies 33 are laminated for layers. In the multilayer substrate body 3, the conductor layers of the circuit bodies 33 are laminated, for example, in order of a first layer 34A, a second layer 34B, and a third layer 34C from one side to the other side of the laminating direction. The connected conductors 36 are, for example, via plugs, and are for electrically connecting the circuit bodies 33 to each other.

The multilayer substrate body 3 includes a pair of through-holes 35 that are formed at an interval in the width direction orthogonal to the laminating direction. Each of the through-holes 35 is a hollow part that is provided by penetrating through the multilayer substrate body 3 along the laminating direction of the circuit bodies 33. Each of the through-holes 35 forms a part in which the magnetic body 4, which will be described later, is inserted and attached. A cross-sectional surface of each of the through-holes 35 in a direction orthogonal to the laminating direction is formed into substantially a rectangular shape. A pair of the through-holes 35 is formed opposed to each other in the width direction across a target part for reducing noise 101 in the multilayer substrate body 3. The target part for reducing noise 101 is a part including the circuit bodies 33 that is a target for reducing noise by the magnetic body 4 in the multilayer substrate body 3. The target part for reducing noise 101 of the present embodiment is a part that is sandwiched by a pair of the through-holes 35 in the multilayer substrate body 3.

Figure 4:
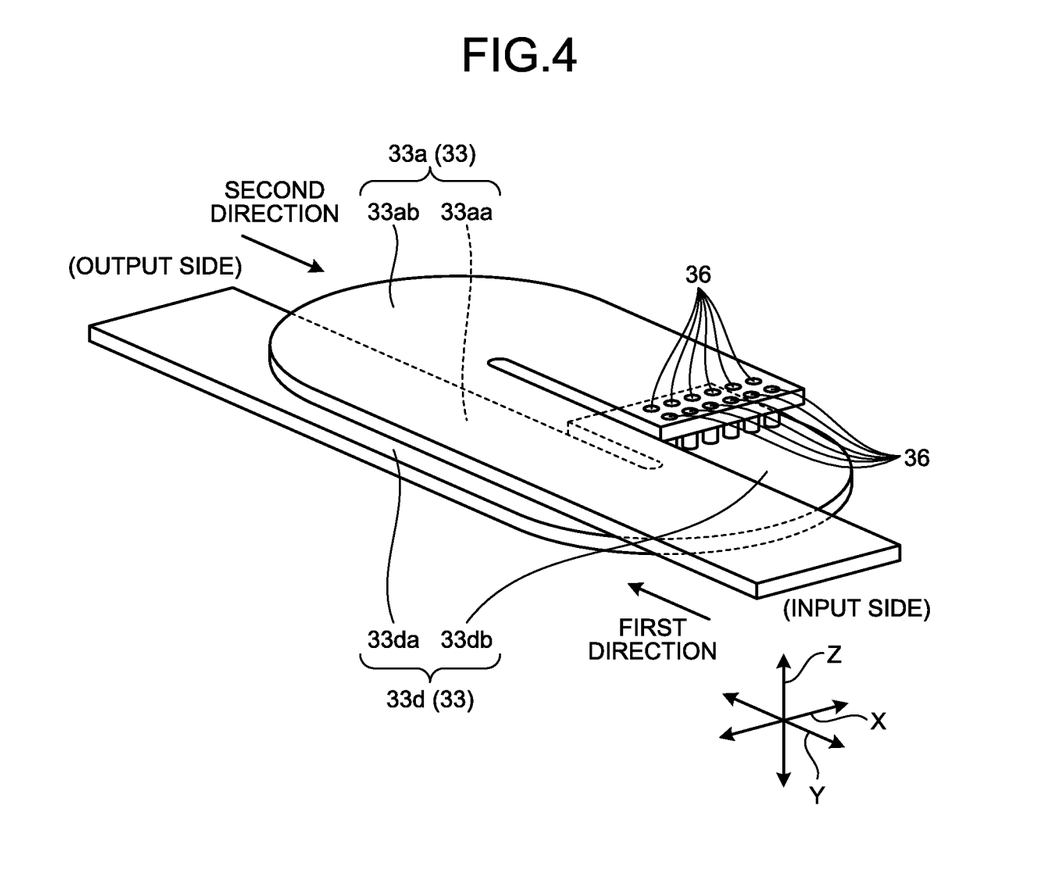
FIG. 4 is a perspective view illustrating the schematic configuration of circuit bodies according to the first embodiment.

As illustrated in FIGS. 2 and 3, the circuit bodies 33 include first circuit bodies 33a, 33b, and 33c, and second circuit bodies 33d, 33e, and 33f. Because the three first circuit bodies 33a to 33c of the present embodiment have the same shape, unless otherwise noted, the first circuit body 33a will be described. Similarly, because the three second circuit bodies 33d to 33f of the present embodiment have the same shape, unless otherwise noted, the second circuit body 33d will be described. As illustrated in FIG. 4, the first circuit body 33a and the second circuit body 33d are formed in substantially a J-shape. The first circuit body 33a is formed of a first extending portion 33aa that extends from an input side to a first direction along a wiring direction and a first folding portion 33ab that is folded back from an end part of the first extending portion 33aa in the first direction to a second direction opposite to the first direction. The second circuit body 33d is formed of a second extending portion 33da that extends from an output side to the second direction and a second folding portion 33db that is folded back from an end part of the second extending portion 33da in the second direction to the first direction. As illustrated in the FIG. 4, the first folding portion 33ab and the second folding portion 33db are each formed into a circular arc shape or a U-shape. The input side is, for example, a side on which a signal is input from a signal source, and a side on which electric power is supplied from a power source. The output side is, for example, a side on which a signal is output to an electronic component, and a side on which electric power is output to a load. The first direction is a direction advancing from one side (input side) to the other side (output side) along the wiring direction, and the second direction is a direction advancing from the other side to the one side along the wiring direction. In the present embodiment, the input side and the output side are set toward an opposite direction, but this is not limiting. The input side and the output side may be set toward the same direction, and may be set toward a direction in which a direction advancing to the input side and a direction advancing to the output side intersect. The wiring direction of the circuit bodies 33 corresponds to, in the target part for reducing noise 101 in the multilayer substrate body 3, at least a direction in which the first extending portion 33aa and the second extending portion 33da extend, and corresponds to, in the present embodiment, the depth direction orthogonal to the width direction in which a pair of the through holes 35 faces.

In the present embodiment, a coiled conductor of two turns (a roll of winding) is formed by connecting the first circuit body 33a and the second circuit body 33d with each other through the connected conductor 36. Similarly, a coiled conductor of two turns is formed by connecting the first circuit body 33b and the second circuit body 33e with each other through the connected conductor 36. Similarly, a coiled conductor of two turns is formed by connecting the first circuit body 33c and the second circuit body 33f with each other through the connected conductor 36. A first circuit body 33A of the present embodiment forms a circuit system in which each of the first circuit bodies 33a, 33b, and 33c is independent in the first layer 34A. A second circuit body 33B forms a circuit system in which each of the second circuit bodies 33d, 33e, and 33f is independent in the second layer 34B. The first circuit body 33a and the second circuit body 33d are interlayer connected via the connected conductor 36, and form the same circuit system. The first circuit body 33a and the second circuit body 33d form, for example, a power source circuit that is connected to a 48-volt (V) power source on wiring 20A. The first circuit body 33b and the second circuit body 33e are interlayer connected via the connected conductor 36, and form the same circuit system. The first circuit body 33b and the second circuit body 33e form, for example, a ground (GND) line for grounding on wiring 20B. The first circuit body 33c and the second circuit body 33f are interlayer connected via the connected conductor 36, and form the same circuit system. The first circuit body 33c and the second circuit body 33f form, for example, a power source circuit that is connected to a 12-V power source on wiring 20C.

Figure 5:
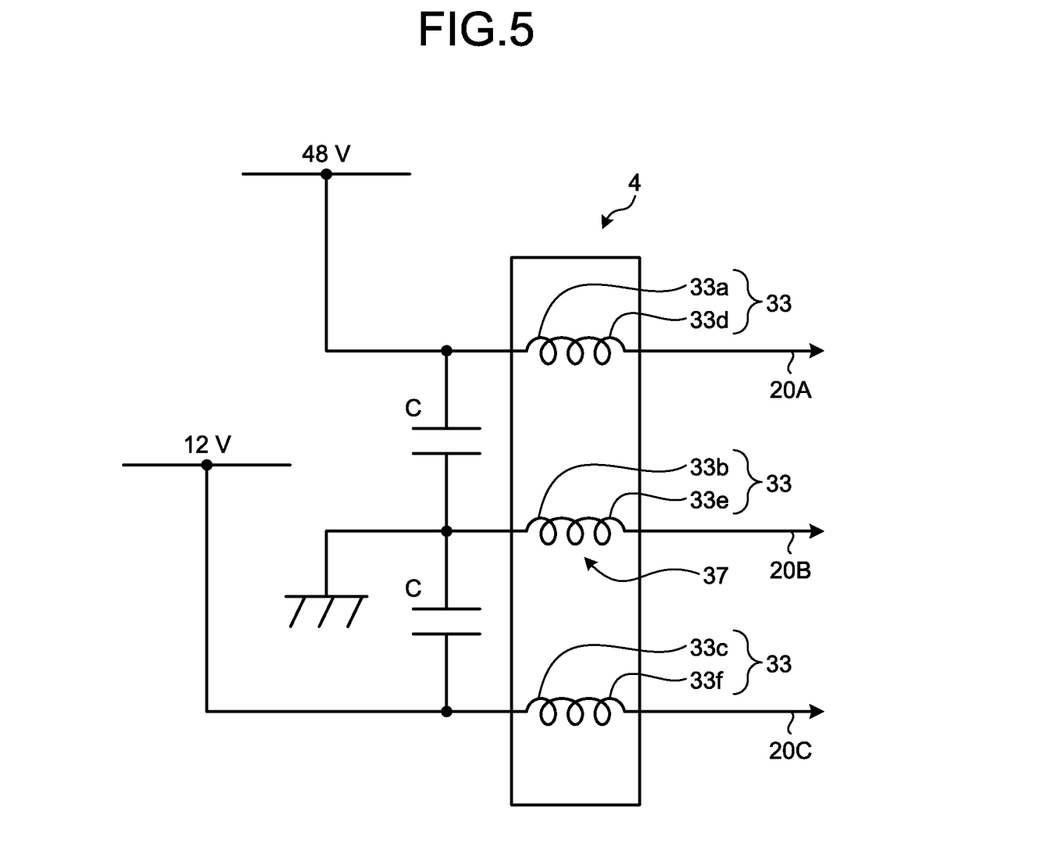
FIG. 5 is a view illustrating the circuit configuration of the circuit bodies according to the first embodiment.

The circuit bodies 33 includes a GND circuit body 37 that is connected to the GND. For example, as illustrated in FIG. 5, the GND circuit body 37 includes the first circuit body 33b and the second circuit body 33e. The first circuit body 33a and the GND circuit body 37 (first circuit body 33b) are electrically connected to each other through a capacitor C. Similarly, the first circuit body 33c and the GND circuit body 37 are electrically connected to each other through a capacitor C. On the target part for reducing noise 101, one of the circuit bodies 33 forms a power source circuit that is connected to the 48-V power source on the wiring 20A, another forms the GND that is grounded on the wiring 20B, and the other forms a power source circuit that is connected to the 12-V power source on the wiring 20C. The wiring 20A and 20C are transmission channels for transmitting electric power of a predetermined voltage to various kinds of devices connected to the substrate 1A. The wiring 20B is what is called a transmission channel for grounding various kinds of devices connected to the substrate 1A. The wiring 20A, 20B, and 20C of the present embodiment are arranged in order of the 48-V power source, the GND, and the 12-V power source in a direction (width direction) orthogonal to the laminating direction. In this manner, the GND can be shared.

At least a part of or all of the magnetic body 4 is arranged across the circuit bodies 33 in the laminating direction so as to reduce noise in each of the circuit bodies 33. The magnetic body 4 is formed of, for example, ferrite that is a magnetic body having high magnetic permeability. The magnetic body 4 of the present embodiment is assembled to the multilayer substrate body 3 through the through-holes 35, and continuously surrounds a part sandwiched by a pair of the through-holes 35 in the multilayer substrate body 3, more specifically, the outside of the target part for reducing noise 101 on which the circuit bodies 33 are laminated. In other words, the magnetic body 4 continuously surrounds at least the outside of the first circuit body 33a and the second circuit body 33d around the wiring direction. By combining a plurality of divided bodies, for example, two divided bodies 41 and 42 with each other, the magnetic body 4 is formed into substantially a circular shape so that the outside of the circuit bodies 33 is continuously surrounded around the wiring direction of the circuit bodies 33. When seen from the respective depth direction, the cross-sectional surface of the divided bodies 41 and 42 is formed into substantially a U-shape.

The substrate 1A described above is formed by connecting the circuit bodies 33 formed of the extending portions (33aa and 33da) and the folding portions (33ab and 33db) through the connected conductor 36 so as to form a coiled conductor of a roll of winding having the laminating direction as a center axis, and having the coiled conductor sandwiched by the magnetic body 4 from the laminating direction. Impedance Z of this coiled conductor is obtained by the following expression (1):

$$Z = R + 2\pi f L \quad (1)$$

R: resistance [mΩ], L: inductance [μH], f: frequency [HZ]

Because inductance L of the coiled conductor is obtained by the following expression (2), impedance Z can be further enhanced by increasing magnetic permeability, the number of winding, and cross-sectional area.

$$L = \mu N^2 |S|/1 \quad (2)$$

μ: magnetic permeability, N: the number of winding, 1: coil length of coiled conductor, |S|: cross-sectional area of coiled conductor Thus, by connecting the circuit bodies 33 formed of the extending portions and the folding portions through the connected conductor 36 so as to form a coiled conductor, the impedance Z can be enhanced, and simple configuration enables a noise filter through which noise components having a high frequency is hard to pass to be obtained.

The substrate 1A described above includes the multilayer substrate body 3 in which the circuit bodies 33 are laminated in the laminating direction through the insulating layers 32 and are interlayer connected via the connected conductor 36 formed on each of the insulating layers 32, and the magnetic body 4 that is arranged in the laminating direction while at least a part of or all of the magnetic body 4 sandwiches the circuit bodies 33. Each of the circuit bodies 33 includes at least the first circuit body 33a and the second circuit body 33d. The first circuit body 33a is formed of the first extending portion 33aa that extends from an input side to the first direction along the wiring direction and the first folding portion 33ab that is folded back from an end part of the first extending portion 33aa in the first direction to the second direction opposite to the first direction. The second circuit body 33d is formed of the second extending portion 33da that extends from an output side to the second direction and the second folding portion 33db that is folded back from an end part of the second extending portion 33da in the second direction to the first direction. With the configuration described above, the circuit bodies 33 formed of the extending portions and the folding portions are connected through the connected conductor 36 so as to form the coiled conductor, thereby enhancing the impedance Z. With the simple configuration, a noise filter through which noise components having a high frequency is hard to pass can be obtained. Thus, noise can be effectively reduced at low cost and electromagnetic compatibility (EMC) performance can be improved. In addition, the size of a whole substrate can be maintained or reduced because components for noise countermeasure do not need to be added.

In the substrate 1A, each of the circuit bodies 33 further includes the GND circuit body 37 that is connected to the GND. The first circuit body 33a and the GND circuit body 37 are connected to each other through the capacitor C. With the configuration described above, for example, the capacitor C is connected between a power source circuit and the GND so as to remove noise generated on the power source circuit. Specifically, the following noise can be removed: normal-mode noise the noise source of which is connected in series to a signal source and that is conducted to a load through a signal line, and common-mode noise the noise source of which exists between a signal line and the GND and that is conducted to two signal lines.

In the substrate 1A, the magnetic body 4 continuously surrounds at least the outside of the first circuit body 33a and the second circuit body 33d around the wiring direction. In this manner, when magnetic flux is generated in the magnetic body 4 upon application of current to each of the circuit bodies 33 and current energy is converted into magnetic energy and when the magnetic energy is returned to the current energy again by electromagnetic induction, magnetic loss occurs and a part of noise current in each of the circuit bodies 33 is reduced. Thus, in the substrate 1A, noise of each of the circuit bodies 33 the outer peripheral side of which is surrounded by the magnetic body 4 is reduced.

Second Embodiment

Figure 6:
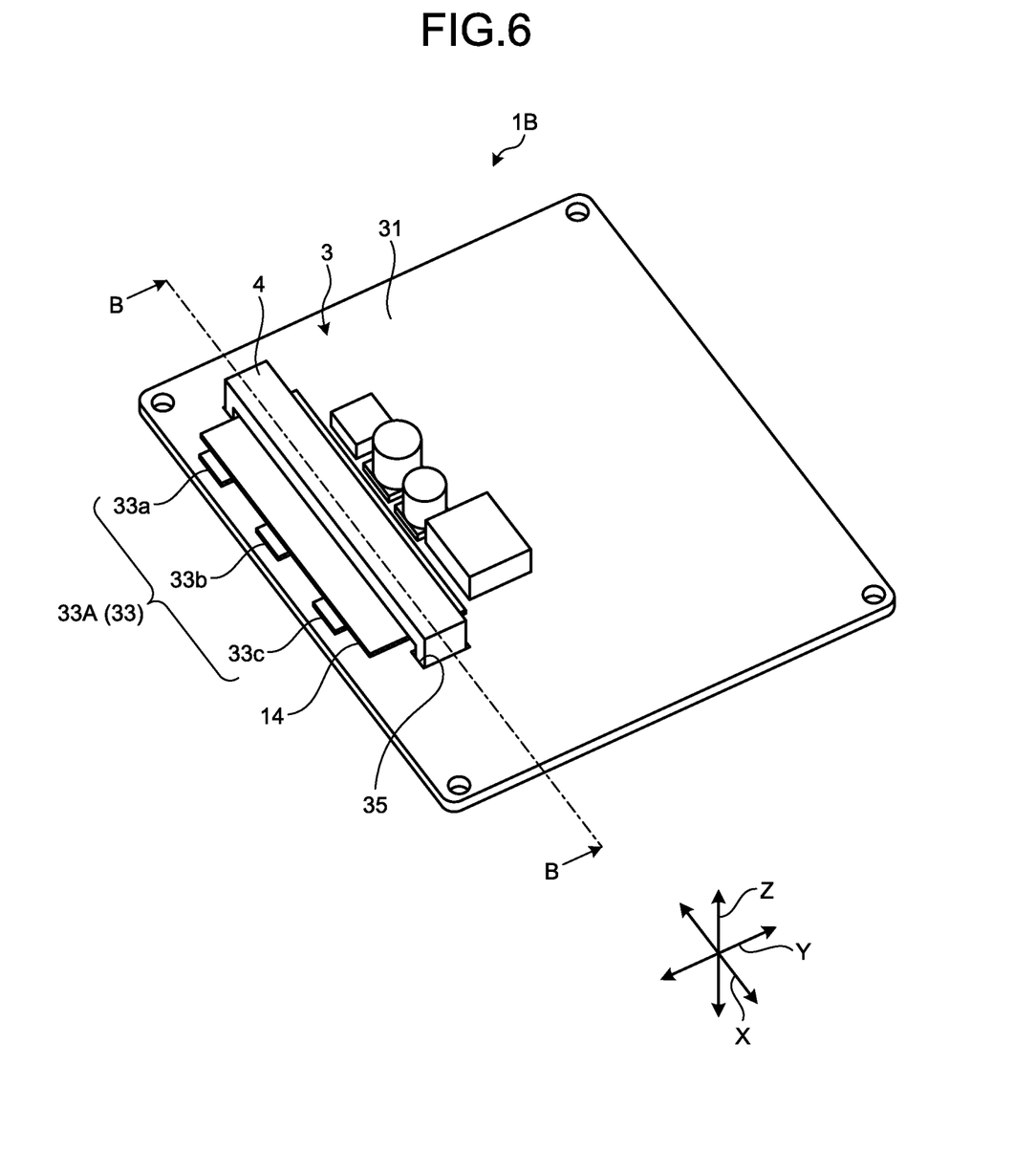
FIG. 6 is a perspective view illustrating the schematic configuration of a substrate according to a second embodiment.
Figure 7:
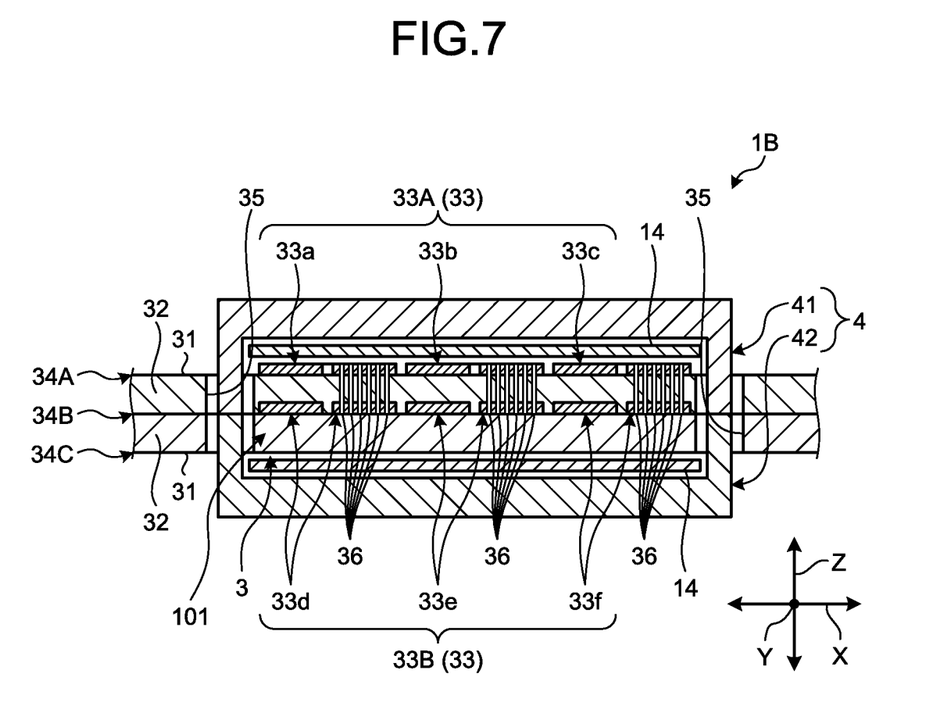
FIG. 7 is a partial cross-sectional view illustrating the schematic configuration of the substrate according to the second embodiment.

A substrate 1B according to a second embodiment is described with reference to FIGS. 6 and 7. FIG. 7 corresponds to a partial cross-sectional view along line B-B in FIG. 6. The configuration of the substrate 1B is different from that of the substrate 1A described above in that a pair of sheet-like magnetic bodies 14 is added. Hereinafter, common numerals are assigned to the same components as those of the first embodiment described above, and duplicate explanation on the common configuration, operation, and effects is omitted as much as possible.

The substrate 1B includes the multilayer substrate body 3, the magnetic body 4, and a pair of the magnetic bodies 14. Each of the magnetic bodies 14 is formed into, for example, a rectangular sheet-like shape (or a thin plate-like shape) that extends along the width and depth directions. Similarly to the magnetic body 4, each of the magnetic bodies 14 is formed of ferrite having high magnetic permeability. It is preferable that each of the magnetic bodies 14 have magnetic permeability equal to or greater than that of the magnetic body 4, but this is not limiting. A pair of the magnetic bodies 14 is arranged inside the magnetic body 4 formed into substantially a circular shape. A pair of the magnetic bodies 14 is arranged inside the magnetic body 4, but may be formed, for example, by extending a width of each of the magnetic bodies 14 in the depth direction at the same length as or longer than that of the magnetic body 4 in the depth direction. A pair of the magnetic bodies 14 is arranged inside the magnetic body 4 formed into substantially a circular shape, and is arranged opposed to each other across the target part for reducing noise 101. More specifically, at least a part of or all of each magnetic body 14 is arranged inside the magnetic body 4, and a part of the magnetic bodies 14 is arranged opposite to each other in the laminating direction across at least the first circuit body 33a and the second circuit body 33d.

In the substrate 1B described above, the magnetic bodies 14 are arranged inside the magnetic body 4, and are arranged opposite to each other in the laminating direction across at least the first circuit body 33a and the second circuit body 33d. By additionally arranging the magnetic bodies 14 in this manner, the magnetic permeability μ can be increased and the inductance L of the coiled conductor can be increased. Thus, the impedance Z can be further enhanced with the above expression (1). Although the number of components in the substrate 1B increases as compared with that in the substrate 1A, the substrate 1B can obtain effects equal to or superior to those of the substrate 1A in the first embodiment described above. For example, the impedance Z roughly doubles as compared with that of the substrate 1A on which only the magnetic body 4 is arranged, and high-frequency noise can be effectively reduced.

Third Embodiment

Figure 8:
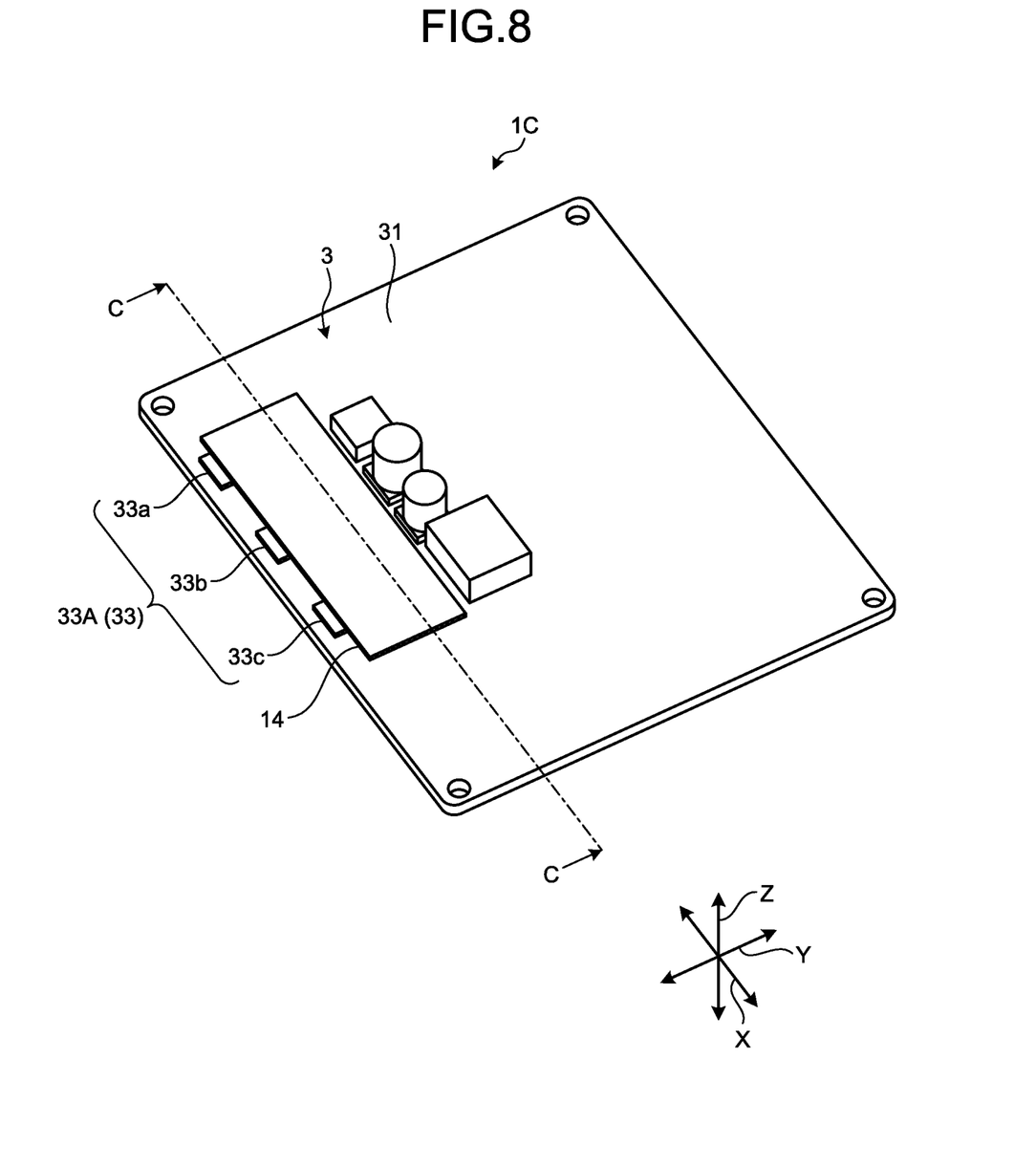
FIG. 8 is a perspective view illustrating the schematic configuration of a substrate according to a third embodiment.
Figure 9:
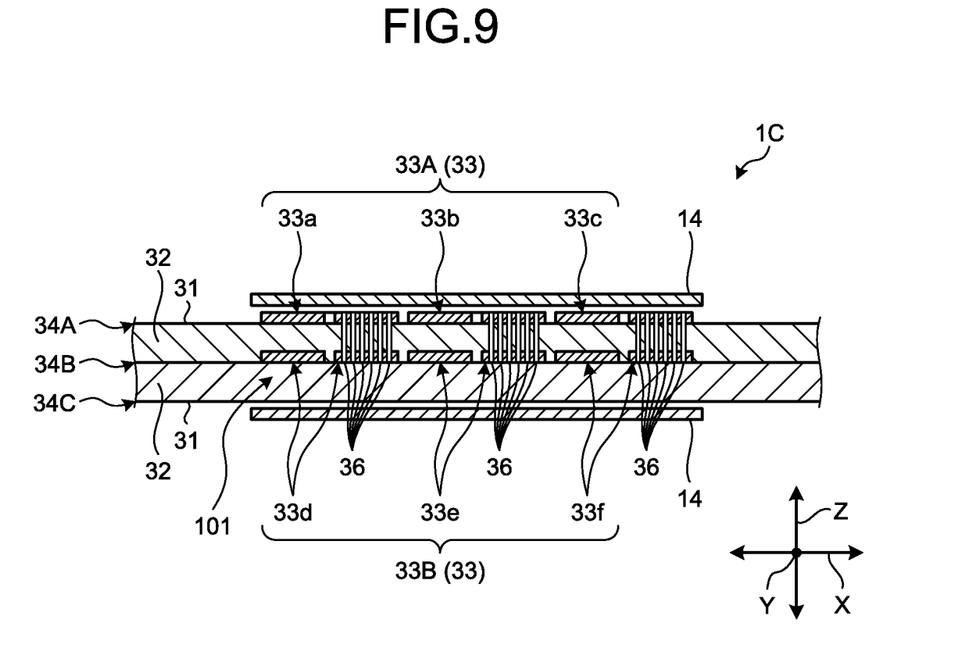
FIG. 9 is a partial cross-sectional view illustrating the schematic configuration of the substrate according to the third embodiment.

A substrate 1C according to a third embodiment is described with reference to FIGS. 8 and 9. FIG. 9 corresponds to a partial cross-sectional view along line C-C in FIG. 8. The configuration of the substrate 1C is different from that of the substrate 1A described above in that a pair of the sheet-like magnetic bodies 14 is arranged in place of the magnetic body 4.

The substrate 1C includes the multilayer substrate body 3 and a pair of the magnetic bodies 14. In the multilayer substrate body 3 of the present embodiment, a pair of the through-holes 35 is not formed. In other words, the multilayer substrate body 3 does not include a pair of the through-holes 35 that is formed opposite to each other in the width direction across the target part for reducing noise 101.

A pair of the magnetic bodies 14 is arranged opposite to each other across the target part for reducing noise 101. The target part for reducing noise 101 of the present embodiment is a part that is sandwiched by a pair of the magnetic bodies 14 arranged opposite to each other in the laminating direction of the multilayer substrate body 3. A pair of the magnetic bodies 14 is arranged opposite to each other in the laminating direction across at least the first circuit body 33a and the second circuit body 33d.

In the substrate 1C described above, the magnetic bodies 14 are arranged opposite to each other in the laminating direction across at least the first circuit body 33a and the second circuit body 33d. By arranging a pair of the sheet-like magnetic bodies 14 opposite to each other in the laminating direction across the circuit bodies 33 in this manner, the magnetic bodies 14 can widely cover the coiled conductor. Thus, the magnetic permeability μ can be increased and the inductance L of the coiled conductor can be increased, the impedance Z can be further enhanced with the above expression (1), and effects equal to or superior to those of the substrate 1A in the first embodiment described above can be obtained. As illustrated in FIG. 3, when a width (width direction) of the magnetic body 4 is defined as W and a height (slit height) of an inner surface side of the magnetic body 4 in the laminating direction is defined as H, if the slit height H is reduced with the same width W, the impedance Z is enhanced in a high frequency (for example, 10 MHz) with the expression (1). As compared with the magnetic body 4, arranging a pair of the sheet-like magnetic bodies 14 opposite to each other in the laminating direction across the circuit bodies 33 enables the magnetic bodies 14 to be moved closer to the circuit bodies 33 in the target part for reducing noise 101. Thus, the inductance L of the coiled conductor can be increased and the impedance Z can be enhanced, and effects equal to or superior to those of the substrate 1A in the first embodiment described above can be obtained.

Modification

Figure 10:
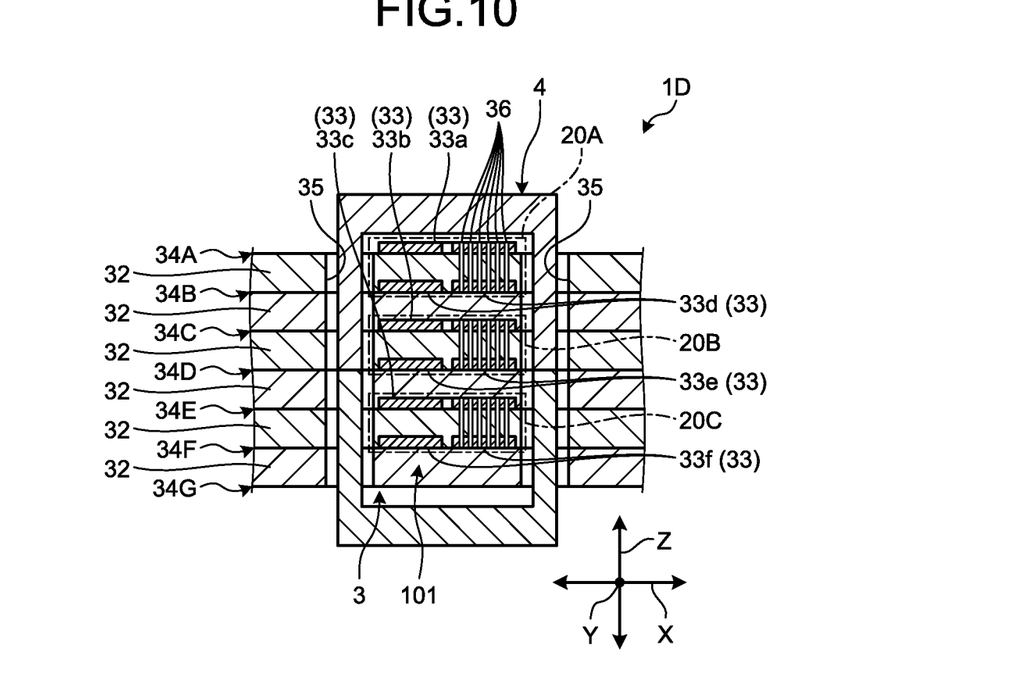
FIG. 10 is a partial cross-sectional view illustrating the schematic configuration of a substrate according to a first modification of the first embodiment.

The first embodiment describes the substrate 1A in which two conductor layers adjacent in the laminating direction are connected to each other so as to form an independent circuit system, and a plurality of the circuit systems are arranged side by side in a direction orthogonal to the laminating direction, but this is not limiting. A substrate 1D according to a first modification of the first embodiment is different from the substrate 1A in that a plurality of the circuit systems are arranged along the laminating direction. FIG. 10 is a partial cross-sectional view illustrating the schematic configuration of the substrate according to the first modification of the first embodiment.

The substrate 1D includes the multilayer substrate body 3 and the magnetic body 4. In the multilayer substrate body 3 of the present embodiment, as illustrated in FIG. 10, by alternately laminating conductor layers of the circuit bodies 33 with respect to the insulating layers 32 for layers, the conductor layers of the circuit bodies 33 are laminated for seven layers. In the multilayer substrate body 3, the conductor layers of the circuit bodies 33 are laminated in order of the first layer 34A, the second layer 34B, the third layer 34C, a fourth layer 34D, a fifth layer 34E, a sixth layer 34F, and a seventh layer 34G from one side to the other side of the laminating direction. The circuit bodies 33 forming the first layer 34A and the second layer 34B are interlayer connected via the connected conductor 36. The first layer 34A forms the first circuit body 33a, and the second layer 34B forms the second circuit body 33d. In the target part for reducing noise 101, the first circuit body 33a and the second circuit body 33d form, for example, a power source circuit that is connected to a 48-V power source on the wiring 20A. The circuit bodies 33 forming the third layer 34C and the fourth layer 34D are interlayer connected via the connected conductor 36. The third layer 34C forms the first circuit body 33b, and the fourth layer 34D forms the second circuit body 33e. In the target part for reducing noise 101, the first circuit body 33b and the second circuit body 33e form, for example, the GND (GND circuit body 37) that is grounded on the wiring 20B. The circuit bodies 33 forming the fifth layer 34E and the sixth layer 34F are interlayer connected via the connected conductor 36. The fifth layer 34E forms the first circuit body 33c, and the sixth layer 34F forms the second circuit body 33f. In the target part for reducing noise 101, the first circuit body 33c and the second circuit body 33f form, for example, a power source circuit that is connected to a 12-V power source on the wiring 20C. The wiring 20A, 20B, and 20C of the present embodiment are arranged in order of the 48-V power source, the GND, and the 12-V power source in the laminating direction. In this manner, the GND can be shared.

With the above configuration, the substrate 1D described above can obtain effects equal to those of the first embodiment described above. It goes without saying that the same effects can be obtained even when the above configuration is applied to the substrate 1B according to the second embodiment and the substrate 1C according to the third embodiment.

Figure 11:
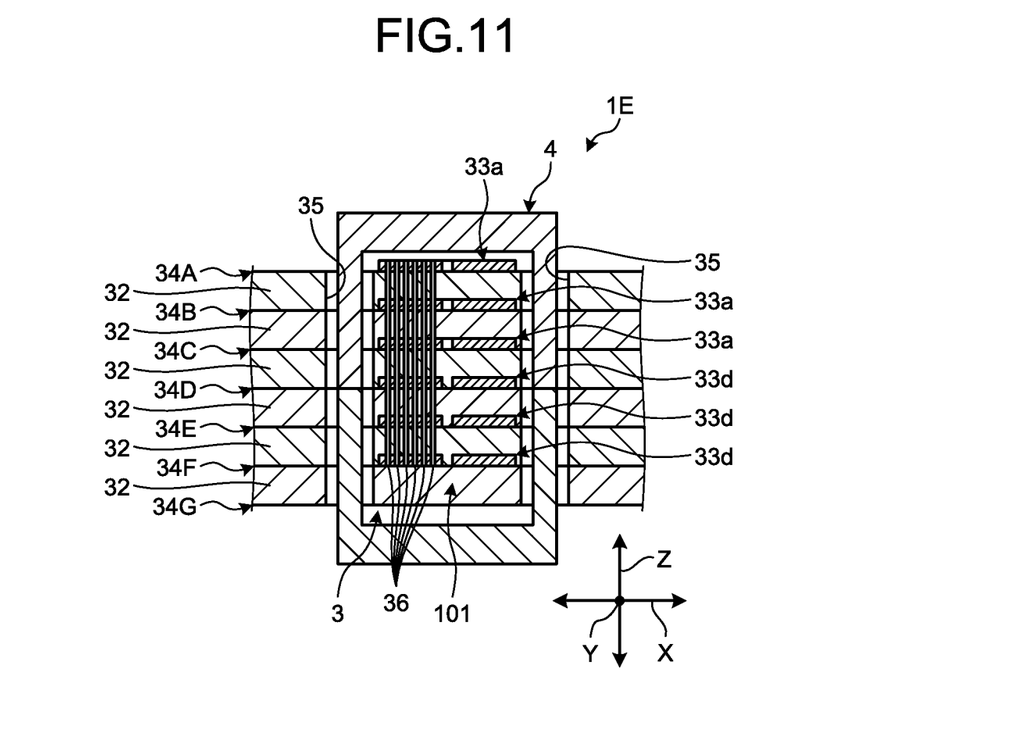
FIG. 11 is a partial cross-sectional view illustrating the schematic configuration of a substrate according to a second modification of the first embodiment.
Figure 12:
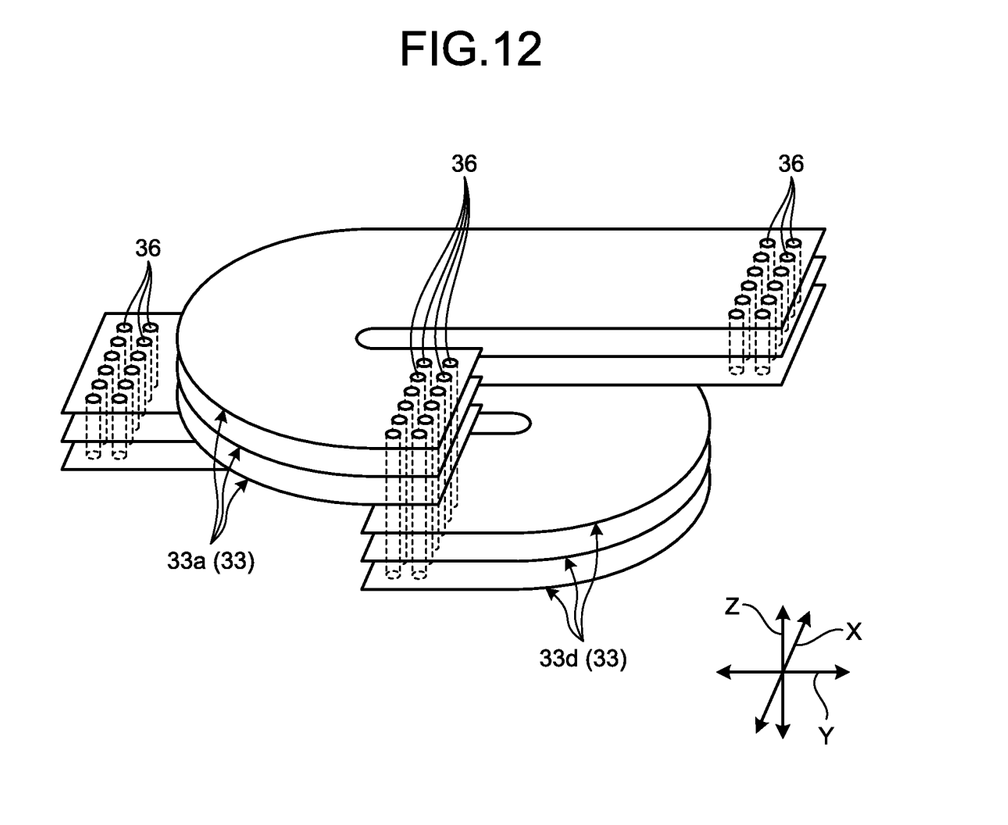
FIG. 12 is a perspective view illustrating the schematic configuration of the circuit bodies according to the second modification of the first embodiment.

In the first embodiment described above, a case where the above configuration is applied to a circuit in which relatively small current such as a signal flows has been described, but this is not limiting. The above configuration may be applied to a circuit in which large current flows. A substrate 1E according to a second modification of the first embodiment is different from the substrate 1A in that the circuit bodies 33 are connected to each other in parallel so as to form one independent circuit system. FIG. 11 is a partial cross-sectional view illustrating the schematic configuration of the substrate according to the second modification of the first embodiment. FIG. 12 is a perspective view illustrating the schematic configuration of the circuit bodies according to the second modification of the first embodiment.

The substrate 1E includes the multilayer substrate body 3 and the magnetic body 4. In the multilayer substrate body 3 of the present embodiment, as illustrated in FIG. 11, by alternately laminating conductor layers of the circuit bodies 33 with respect to the insulating layers 32 for layers, the conductor layers of the circuit bodies 33 are laminated for seven layers. In the multilayer substrate body 3, the conductor layers of the circuit bodies 33 are laminated in order of the first layer 34A, the second layer 34B, the third layer 34C, the fourth layer 34D, the fifth layer 34E, the sixth layer 34F, and the seventh layer 34G from one side to the other side of the laminating direction. The circuit bodies 33 forming the first layer 34A, the second layer 34B, and the third layer 34C are interlayer connected via the connected conductor 36. In other words, the first layer 34A to the third layer 34C are formed of the three first circuit bodies 33a. The circuit bodies 33 forming the fourth layer 34D, the fifth layer 34E, and the sixth layer 34F are interlayer connected via the connected conductor 36. In other words, the fourth layer 34D to the sixth layer 34F are formed of the three second circuit bodies 33d. In the target part for reducing noise 101, the first circuit body 33a and the second circuit body 33d form, for example, a power source circuit that is connected to a high-voltage power source and the grounded GND (GND circuit body 37).

With the above configuration, the substrate 1E described above has larger cross-sectional area of the coiled conductor and can increase allowable current of the circuit bodies 33. Thus, the above configuration can be applied to a substrate requiring a large amount of electric power. It goes without saying that the same effects can be obtained even when the above configuration is applied to the substrate 1B according to the second embodiment and the substrate 1C according to the third embodiment described above.

Figure 13:
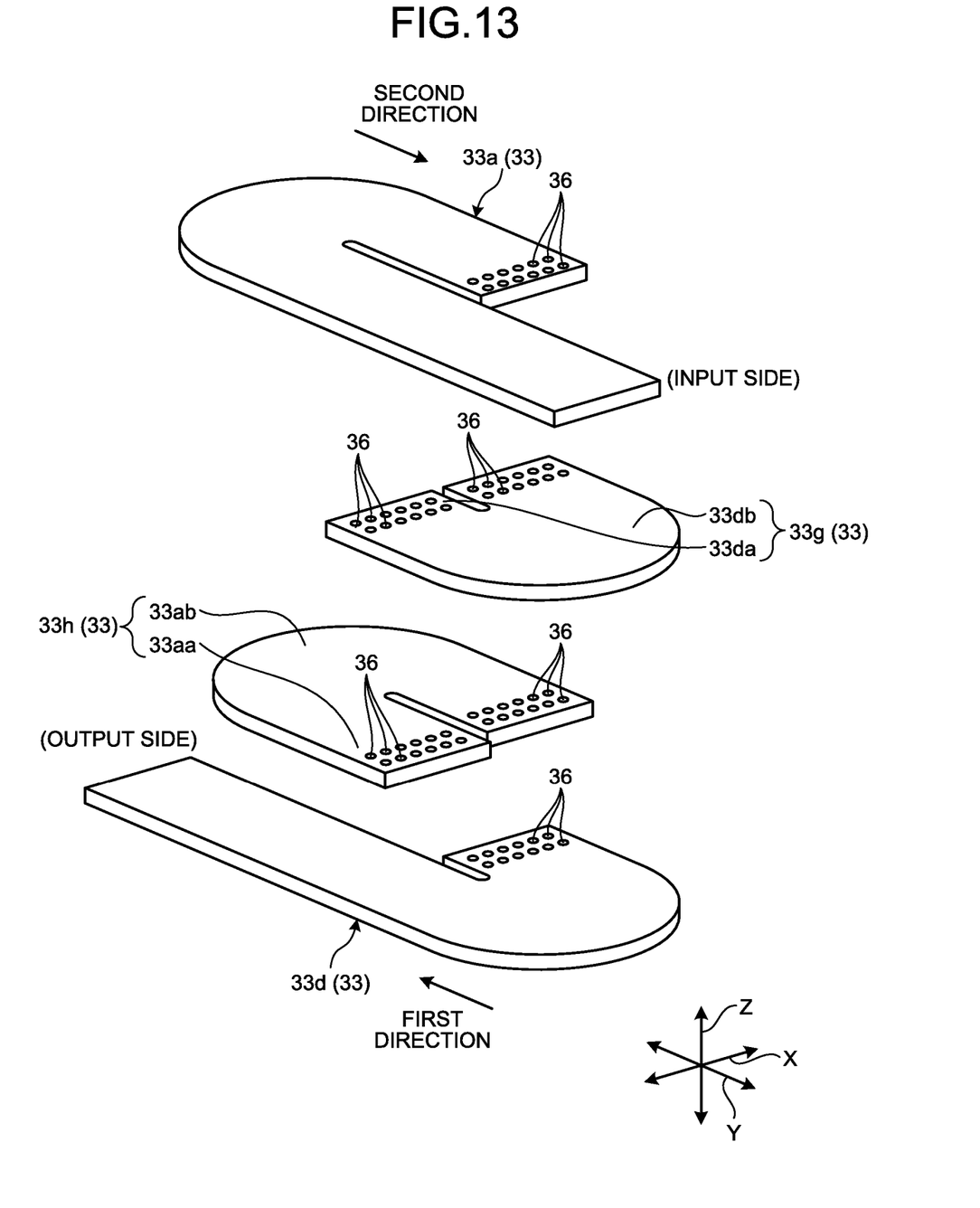
FIG. 13 is an exploded perspective view illustrating the schematic configuration of the circuit bodies according to a third modification of the first embodiment.

In the first embodiment described above, as illustrated in FIG. 4, a coiled conductor of two turns (a roll of winding) is formed by connecting the first circuit body 33a and the second circuit body 33d with each other through the connected conductor 36, but this is not limiting. For example, as illustrated in FIG. 13, a coiled conductor of four turns (two rolls of winding) may be formed by arranging two circuit bodies 33g and 33h between the first circuit body 33a and the second circuit body 33d and connecting the circuit bodies 33a, 33d, 33g and 33h to each other through the connected conductor 36. Similarly to the second circuit body 33d, the circuit body 33g is formed of the second extending portion 33da that extends from an output side to the second direction and the second folding portion 33db that is folded back from an end part of the second extending portion 33da in the second direction to the first direction. Similarly to the first circuit body 33*a*, the circuit body 33*h* is formed of the first extending portion 33*aa* that extends from an input side to the first direction along the wiring direction and the first folding portion 33*ab* that is folded back from an end part of the first extending portion 33*aa* in the first direction to the second direction opposite to the first direction. With this configuration, the number of turns of a coiled conductor, in other words, the number of winding can be increased. Thus, the impedance Z can be enhanced. The number of turns of a coiled conductor is not limited to an even turn, and may be an odd turn.

In the first embodiment described above, the first folding portion 33*ab* and the second folding portion 33*db* are each formed into a circular arc shape or a U-shape, respectively, but these are not limiting. The first folding portion 33*ab* and the second folding portion 33*db* may be formed into a polygonal shape. In other words, a winding part of a coiled conductor formed by connecting the first circuit body 33*a* and the second circuit body 33*d* to each other through the connected conductor 36 may be round or polygonal. If a winding part of a coiled conductor is formed into a round or a polygonal shape, the first folding portion 33*ab* and the second folding portion 33*db* may have any shape.

The substrate according to the present embodiments can reduce noise at low cost.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A substrate comprising:
a multilayer substrate body in which a plurality of circuit bodies are laminated in a laminating direction on respective surfaces of insulating layers and are interlayer connected via a connected conductor formed on each of the insulating layers, the plurality of circuit bodies comprises a first circuit body provided directly on an implementation surface of the multilayer substrate body and a second circuit body provided directly on the implementation surface of the multilayer substrate body adjacent to the first circuit body in a direction different from the laminating direction; and
a magnetic body that is arranged in the laminating direction wherein at least a part of or all of the magnetic body sandwiches both the first circuit body and the second circuit body,
wherein the first circuit body and the second circuit body are arranged adjacent to each other in a horizontal direction on a top layer of the multilayer substrate body, wherein
each of the plurality of circuit bodies includes:
a first circuit body portion that is formed of a first extending portion extending from an input side to a first direction along a wiring direction and a first folding portion folded back from an end part of the first extending portion in the first direction to a second direction opposite to the first direction, and
a second circuit body portion that is formed of a second extending portion extending from an output side to the second direction and a second folding portion folded back from an end part of the second extending portion in the second direction to the first direction.

2. The substrate according to claim 1, wherein
the plurality of circuit bodies further includes a ground circuit body that is connected to a ground, and the first circuit body and the ground circuit body are connected to each other through a capacitor.

3. The substrate according to claim 1, wherein
the magnetic body continuously surrounds at least outside of the first circuit body portion and the second circuit body portion around the wiring direction.

4. The substrate according to claim 2, wherein
the magnetic body continuously surrounds at least outside of the first circuit body portion and the second circuit body portion around the wiring direction.

5. The substrate according to claim 1, wherein
the magnetic body comprises a first magnetic body portion and a second magnetic body portion, each formed into a sheet-like shape, and arranged opposite to each other in the laminating direction across at least the first circuit body and the second circuit body.

6. The substrate according to claim 2, wherein
the magnetic body comprises a first magnetic body portion and a second magnetic body portion, each formed into a sheet-like shape, and arranged opposite to each other in the laminating direction across at least the first circuit body and the second circuit body.

7. A substrate comprising:
a multilayer substrate body in which a plurality of circuit bodies are laminated in a laminating direction on respective surfaces of insulating layers and are interlayer connected via a connected conductor formed on each of the insulating layers, the plurality of circuit bodies comprises a first circuit body provided directly on an implementation surface of the multilayer substrate body and a second circuit body provided directly on the implementation surface of the multilayer substrate body adjacent to the first circuit body in a direction different from the laminating direction; and
a magnetic body that is arranged in the laminating direction wherein at least a part of or all of the magnetic body sandwiches both the first circuit body and the second circuit body, wherein
the first circuit body includes:
a first circuit body portion that is formed of a first extending portion extending from an input side to a first direction along a wiring direction and a first folding portion folded back from an end part of the first extending portion in the first direction to a second direction opposite to the first direction, and
a second circuit body portion that is formed of a second extending portion extending from an output side to the second direction and a second folding portion folded back from an end part of the second extending portion in the second direction to the first direction, the second folding portion is interlayer connected with the first folding portion via the connected conductor,
the second circuit body includes:
a third circuit body portion that is formed of a third extending portion extending from an input side to the first direction along the wiring direction and a third folding portion folded back from an end part of the third extending portion in the first direction to the second direction, and
a fourth circuit body portion that is formed of a fourth extending portion extending from an output side to the second direction and a fourth folding portion folded back from an end part of the fourth extending portion in the second direction to the first direction, the fourth folding portion is interlayer connected with the third folding portion via the other connected conductor, the second circuit body is a ground circuit body that is connected to a ground, and the first circuit body portion and the third circuit body portion are connected to each other through a capacitor, wherein the magnetic body sandwiches the ground circuit body, and wherein the first circuit body and the second circuit body are arranged adjacent to each other in a horizontal direction on a top layer of the multilayer substrate body.

8. The substrate according to claim 7, wherein the first extending portion and the first folding portion are integrally formed, the second extending portion and the second folding portion are integrally formed, the third extending portion and the third folding portion are integrally formed, and the fourth extending portion and the fourth folding portion are integrally formed.

9. The substrate according to claim 1, wherein the first extending portion of the first circuit body is formed on a top layer of the multilayer substrate body, and wherein the second extending portion of the second circuit body is formed on the same top layer of the multilayer substrate body.

10. The substrate according to claim 9, wherein the magnetic body includes a first magnetic portion provided above the top layer of the of the multilayer substrate body, and wherein the first magnetic portion extends in a third direction perpendicular to the first direction and the second direction.

11. The substrate according to claim 10, wherein the magnetic portion overlaps a middle portion of the first extending portion and the second extending portion.

12. The substrate according to claim 7, wherein the first extending portion of the first circuit body is formed on a top layer of the multilayer substrate body, and wherein the second extending portion of the second circuit body is formed on the same top layer of the multilayer substrate body.

13. The substrate according to claim 12, wherein the magnetic body includes a first magnetic portion provided above the top layer of the of the multilayer substrate body, and wherein the first magnetic portion extends in a third direction perpendicular to the first direction and the second direction.

14. The substrate according to claim 13, wherein the magnetic portion overlaps a middle portion of the first extending portion and the second extending portion.

* * * * *